United States Patent
Li et al.

(10) Patent No.: US 10,382,109 B2
(45) Date of Patent: Aug. 13, 2019

(54) METHOD AND CONTROLLER FOR RECEIVING BEAM CONTROL IN MIMO SYSTEM AS WELL AS RADIO UNIT AND BASE STATION

(71) Applicant: Telefonaktiebolaget LM Ericsson (publ), Stockholm (SE)

(72) Inventors: Ming Li, Beijing (CN); Qingyu Miao, Beijing (CN); Jianfeng Wang, Beijing (CN); Virgile Garcia, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 91 days.

(21) Appl. No.: 15/528,190

(22) PCT Filed: Jan. 23, 2017

(86) PCT No.: PCT/CN2017/072245
§ 371 (c)(1),
(2) Date: May 19, 2017

(87) PCT Pub. No.: WO2018/133117
PCT Pub. Date: Jul. 26, 2018

(65) Prior Publication Data
US 2018/0323843 A1   Nov. 8, 2018

(51) Int. Cl.
*H04B 7/06* (2006.01)
*H03G 3/30* (2006.01)
(Continued)

(52) U.S. Cl.
CPC ......... *H04B 7/0617* (2013.01); *H03G 3/3042* (2013.01); *H04B 7/0639* (2013.01);
(Continued)

(58) Field of Classification Search
CPC .... H04B 7/0617; H04B 7/0408; H04B 7/086; H04B 7/0634; H04B 7/0639; H04B 7/0857
(Continued)

(56) References Cited

U.S. PATENT DOCUMENTS 6,115,409 A * 9/2000 Upadhyay ............ H01Q 3/2605
370/487
8,681,890 B2   3/2014 Petrovic
(Continued)

FOREIGN PATENT DOCUMENTS

CN   103098404 A   5/2013
CN   1104702308 A   6/2015

OTHER PUBLICATIONS

International Search Report and Written Opinion for International Patent Application No. PCT/CN2017/072245, dated Jun. 30, 2017, 12 pages.

*Primary Examiner* — Emmanuel Bayard
(74) *Attorney, Agent, or Firm* — Withrow & Terranova, PLLC

(57) ABSTRACT

Method and controller are disclosed for receiving beam control in MIMO system. According to an embodiment, a measured power of a signal is obtained from a power meter. The signal is generated by a beamforming combiner by combining multiple inputs from an antenna array, and represents a first receiving beam with a first gain and a first pointing direction. Whether to apply beam gain control is judged based on the obtained power. In response to a positive judgment result, a target gain is determined. The target gain is converted to a target beamforming parameter. The target beamforming parameter is provided to the beamforming combiner, such that the first receiving beam is replaced by a second receiving beam with the target gain and the first pointing direction. A radio unit comprising the controller and a base station comprising the radio unit are also disclosed.

15 Claims, 11 Drawing Sheets

(51) Int. Cl.
*H04W 72/04* (2009.01)
*H04B 7/08* (2006.01)
*H04L 5/00* (2006.01)
*H04B 7/02* (2018.01)
*H04W 52/42* (2009.01)

(52) U.S. Cl.
CPC ........ *H04B 7/0848* (2013.01); *H04W 72/042* (2013.01); *H04B 7/02* (2013.01); *H04L 5/0023* (2013.01); *H04W 52/42* (2013.01)

(58) Field of Classification Search
USPC .................................. 375/267, 299, 347–349
See application file for complete search history.

(56) References Cited

U.S. PATENT DOCUMENTS

| | | | |
|---|---|---|---|
| 2002/0070892 A1* | 6/2002 | Kikuchi | H01Q 1/246 342/368 |
| 2004/0192389 A1* | 9/2004 | Kim | H04B 7/0848 455/561 |
| 2004/0204111 A1* | 10/2004 | Ylitalo | H04W 16/28 455/562.1 |
| 2004/0213187 A1* | 10/2004 | Fujil | H04B 7/0408 370/335 |
| 2007/0016024 A1* | 1/2007 | Simopoulos | A61B 8/08 600/437 |
| 2007/0285312 A1* | 12/2007 | Gao | H01Q 1/246 342/367 |
| 2008/0240031 A1* | 10/2008 | Nassiri-Toussi | H04B 7/0408 370/329 |
| 2008/0273636 A1 | 11/2008 | Zhu et al. | |
| 2009/0033555 A1* | 2/2009 | Niu | H01Q 3/26 342/372 |
| 2009/0304128 A1 | 12/2009 | Izumi et al. | |
| 2010/0159854 A1 | 6/2010 | Kim et al. | |
| 2011/0059706 A1* | 3/2011 | Harel | H04B 7/0404 455/115.1 |
| 2011/0241931 A1* | 10/2011 | Krich | G01S 7/2813 342/159 |
| 2014/0211891 A1* | 7/2014 | Park | H04B 1/16 375/345 |
| 2016/0315686 A1* | 10/2016 | Song | H01Q 3/446 |
| 2016/0381569 A1* | 12/2016 | Wang | H04W 16/28 370/338 |
| 2018/0062274 A1* | 3/2018 | Madsen | H01Q 21/22 |
| 2018/0254840 A1* | 9/2018 | Foegelle | H04B 17/13 |

* cited by examiner

METHOD AND CONTROLLER FOR RECEIVING BEAM CONTROL IN MIMO SYSTEM AS WELL AS RADIO UNIT AND BASE STATION

This application is a 35 U.S.C. § 371 national phase filing of International Application No. PCT/CN2017/072245, filed Jan. 23, 2017, the disclosure of which is incorporated herein by reference in its entirety.

TECHNICAL FIELD

Embodiments of the disclosure generally relate to wireless communication, and, more particularly, to method and controller for receiving beam control in multiple-input multiple-output (MIMO) system as well as radio unit and base station.

BACKGROUND

Antenna array has been widely used in base stations. It generally comprises a set of individual antenna elements. In combination with MIMO technologies, the capacity of wireless channel may be increased without increasing the bandwidth and transmission power. Recently, massive MIMO (also known as large-scale antenna systems, very large MIMO, or hyper MIMO) has been developed. It makes use of a very large amount (e.g., hundreds or thousands) of service antennas that are operated fully coherently and adaptively. Thereby, the transmission and reception of signal energy can be focused into ever-smaller regions of space. This can bring huge improvements in throughput and energy efficiency, in particular when combined with simultaneous scheduling of a large number (e.g., tens or hundreds) of user terminals. Other benefits of massive MIMO include the extensive use of inexpensive low-power components, reduced latency, simplification of the media access control (MAC) layer, and robustness to interference and intentional jamming.

Beamforming is a signal processing technique usually used in antenna array of MIMO system for directional signal transmission or reception. This may be achieved by combining antenna elements in a phased array in such a way that signals at particular angles experience constructive interference while others experience destructive interference. Beamforming can be used at both the transmitting and receiving ends in order to achieve spatial selectivity.

Analog beamforming implementations usually rely on a list of predefined beams (or codebooks) that can be selected to transmit/receive data streams. Beams can be set to form sectors, hotspots, or some spatial separations to allow user multiplexing. An antenna array spanning over two dimensions can perform both vertical and horizontal beam shaping. It is generally desirable to have a set of beams that can span the entire desired coverage area of the antenna array to avoid coverage holes for example.

In receiver side, analog beamforming is a method that applies weights (usually phase shifts) to the signals from the antenna elements and combines them in order to increase the antenna gain from a given direction. This combining is done in an analog domain, i.e. before the signal is converted to a digital stream. The result of such combining is treated as a digital stream by a digital front-end and a baseband processing unit.

FIG. 1 is a schematic architectural diagram showing a receiver having an analog beamforming combiner. As shown, the receiver 100 may comprise a plurality of antenna elements 102 for receiving radio frequency (RF) signals. Here, four antenna elements are shown as an exemplary example. The RF signals may be processed by respective RF processing units 104 such that the processed signals are provided to a beamforming combiner 106. The beamforming combiner 106 may apply phase shifting to the processed signals by a plurality of phase shifters 108, and combine the signals after phase shifting, wherein the coefficients of the phase shifters are beamforming weights. The combined signal may be converted to a digital signal by an analog-to-digital converter (ADC) 110, and may be further processed by a digital front-end 112.

The architecture shown in FIG. 1 is usually used in beam sweeping. FIG. 2 is a schematic diagram of beam sweeping. As shown, beam sweeping is a method used to scan the desired coverage area with beams in corresponding directions. This is needed when the location of a user is not known correctly, such as during random access procedure. To make sure that the desired coverage area is well covered, the transmitter tries all the beam directions available. For example, three beams with different beam indices (e.g., beam index 1, beam index 2 and beam index 3) are shown in FIG. 2 for illustration. To achieve maximum coverage, the beams used for covering respective directions are usually configured with a maximum gain.

During beam sweeping, the power levels and phases of signals received from the antenna array may change rapidly, and thus receiving beam control is performed in the receiver. However, when existing solutions for receiving beam control are used in a massive MIMO, new problems arise, resulting in the performance degradation or very high cost of the receiver. Therefore, it would be desirable to provide an effective and low cost solution for receiving beam control.

SUMMARY

This summary is provided to introduce a selection of concepts in a simplified form that are further described below in detailed description. This summary is not intended to identify key features or essential features of the claimed subject matter, nor is it intended to be used to limit the scope of the claimed subject matter.

One of the objects of the disclosure is to provide an effective and low cost solution for receiving beam control.

According to one aspect of the disclosure, it is provided a method for receiving beam control in multiple-input multiple-output (MIMO) system. The method comprises obtaining, from a power meter, a measured power of a signal, wherein the signal is generated by a beamforming combiner by combining multiple inputs from an antenna array, and represents a first receiving beam with a first gain and a first pointing direction. The method further comprises judging whether to apply beam gain control based on the obtained power. The method further comprises in response to a positive judgment result, determining a target gain. The method further comprises converting the target gain to a target beamforming parameter. The method further comprises providing the target beamforming parameter to the beamforming combiner, such that the first receiving beam is replaced by a second receiving beam with the target gain and the first pointing direction.

Optionally, the step of judging comprises judging whether the obtained power is greater than or equal to a first threshold. The step of determining comprises: when the obtained power is greater than or equal to the first threshold, determining a target gain which is smaller than the first gain.

Optionally, the step of judging comprises judging whether the obtained power is smaller than a second threshold for a predetermined time length. The step of determining comprises: when the obtained power is smaller than the second threshold for the predetermined time length, determining a target gain which is greater than the first gain.

Optionally, the target beamforming parameter is represented by: a beam index comprising two levels of indices, wherein a first level of index corresponds to a pointing direction of a receiving beam, and a second level of index corresponds to a gain of the receiving beam; or one of a set of codebooks which contain weight vectors applied to the multiple inputs for generating receiving beams with multiple pointing directions and multiple gains in each pointing direction.

According to another aspect of the disclosure, it is provided a controller for receiving beam control in multiple-input multiple-output (MIMO) system. The controller comprises a processor and a memory. The memory contains instructions executable by the processor, whereby the controller is operative to obtain, from a power meter, a measured power of a signal, wherein the signal is generated by a beamforming combiner by combining multiple inputs from an antenna array, and represents a first receiving beam with a first gain and a first pointing direction. The instructions are executable by the processor, whereby the controller is further operative to judge whether to apply beam gain control based on the obtained power. The instructions are executable by the processor, whereby the controller is further operative to, in response to a positive judgment result, determine a target gain. The instructions are executable by the processor, whereby the controller is further operative to convert the target gain to a target beamforming parameter. The instructions are executable by the processor, whereby the controller is further operative to provide the target beamforming parameter to the beamforming combiner, such that the first receiving beam is replaced by a second receiving beam with the target gain and the first pointing direction.

Optionally, the instructions are executable by the processor, whereby the controller is further operative to report the beamforming parameter to a baseband processing unit.

According to another aspect of the disclosure, it is provided a radio unit (RU) for a base station (BS). The radio unit (RU) comprises an antenna array, a beamforming combiner coupled to the antenna array, a power meter coupled to the beamforming combiner, and the controller according to the above aspect.

Optionally, the beamforming combiner is connected directly to the antenna array, or connected to the antenna array via a radio frequency (RF) processing unit.

Optionally, the power meter is connected directly to the beamforming combiner, or connected to the beamforming combiner via an analog-to-digital converter.

Optionally, the beamforming combiner has an amplitude adjustment capability.

According to another aspect of the disclosure, it is provided a base station (BS). The BS comprises the radio unit (RU) according to the above aspect.

According to another aspect of the disclosure, it is provided a computer program. The computer program comprises instructions which when executed by at least one processor, cause the at least one processor to perform the method according to the above aspect.

According to another aspect of the disclosure, it is provided a computer readable storage medium. The computer readable storage medium comprises instructions which when executed by at least one processor, cause the at least one processor to perform the method according to the above aspect.

According to another aspect of the disclosure, it is provided a controller for receiving beam control in multiple-input multiple-output (MIMO) system. The controller comprises an obtaining module for obtaining, from a power meter, a measured power of a signal, wherein the signal is generated by a beamforming combiner by combining multiple inputs from an antenna array, and represents a first receiving beam with a first gain and a first pointing direction. The controller further comprises a judgment module for judging whether to apply beam gain control based on the obtained power. The controller further comprises a determination module for, in response to a positive judgment result, determining a target gain. The controller further comprises a conversion module for converting the target gain to a target beamforming parameter. The controller further comprises a provision module for providing the target beamforming parameter to the beamforming combiner, such that the first receiving beam is replaced by a second receiving beam with the target gain and the first pointing direction.

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
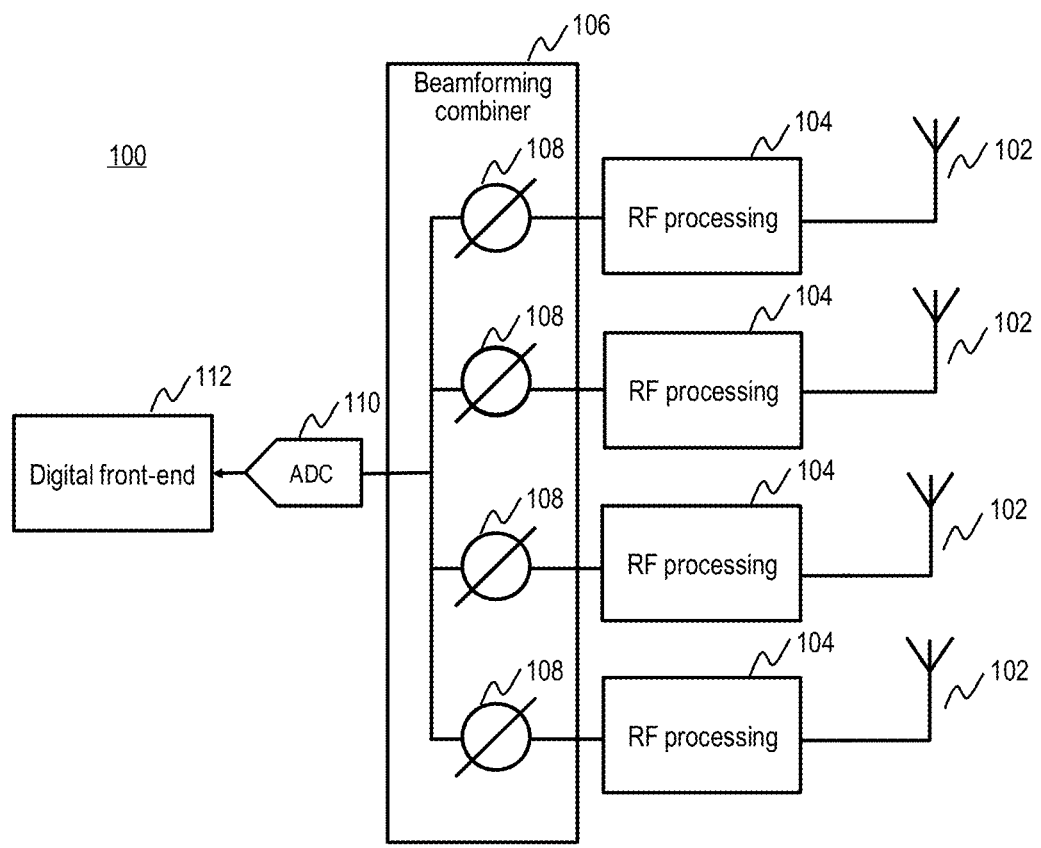
FIG. 1 is a schematic architectural diagram showing a receiver having an analog beamforming combiner.
Figure 2:
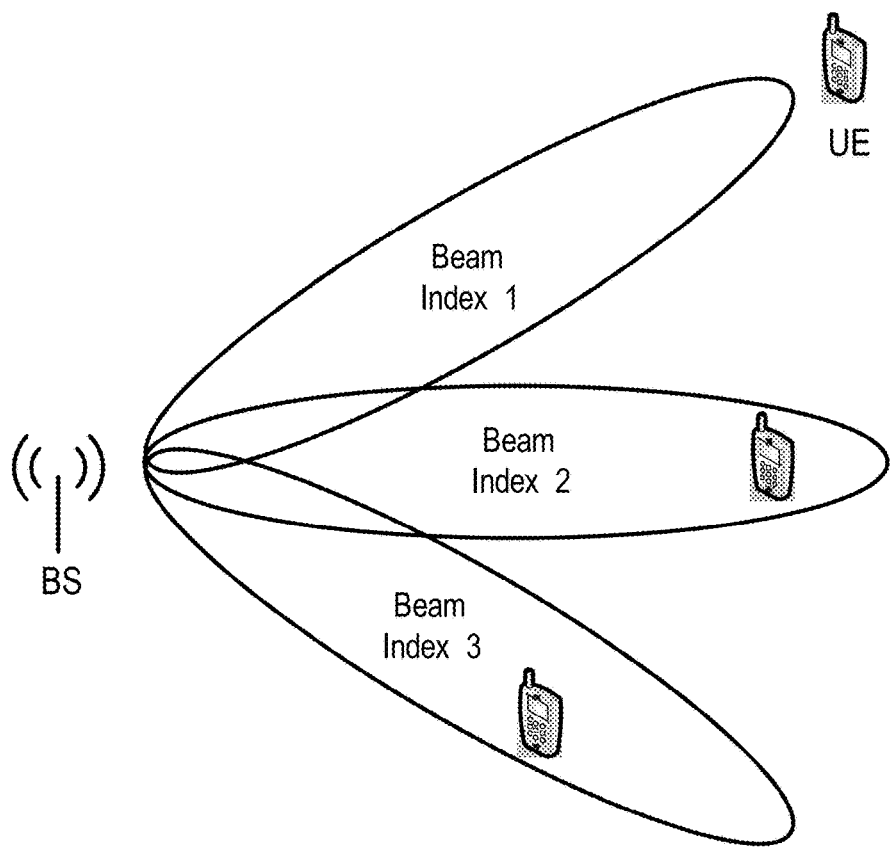
FIG. 2 is a schematic diagram of beam sweeping.
Figure 3:
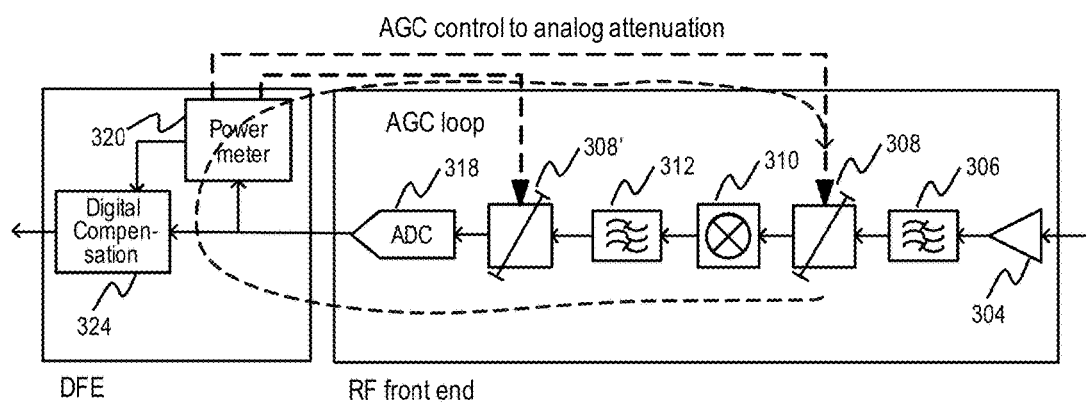
FIG. 3 is a schematic architectural diagram of AGC function.

As mentioned above, during beam sweeping, the power levels and phases of signals received from the antenna array may change rapidly, and thus receiving beam control is performed in the receiver. In general, automatic gain control (AGC) function is usually used in the receiver to ensure that a signal received by the receiver is processed at a suitable power level (also referred to as signal power). The AGC function may be used to adjust the gains of the received signals in response to high power levels for example. FIG. 3 is a schematic architectural diagram of AGC function. As shown, the RF front-end comprises a low noise amplifier (LNA) 304, a first filter 306, a first attenuator 308, a mixer 310, a second filter 312, a second attenuator 308' and an ADC 318. The digital front-end comprises a digital power meter 320 and a digital compensation unit 324. The devices in the dashed circle show an 'AGC loop', which may include the digital power meter 320 for measuring the received power level, at least one trigger for triggering analog attenuation, at least one attenuator (e.g., 308 and 308'), and the digital compensation unit 324 for keeping uniform receiver gain.

Figure 4:
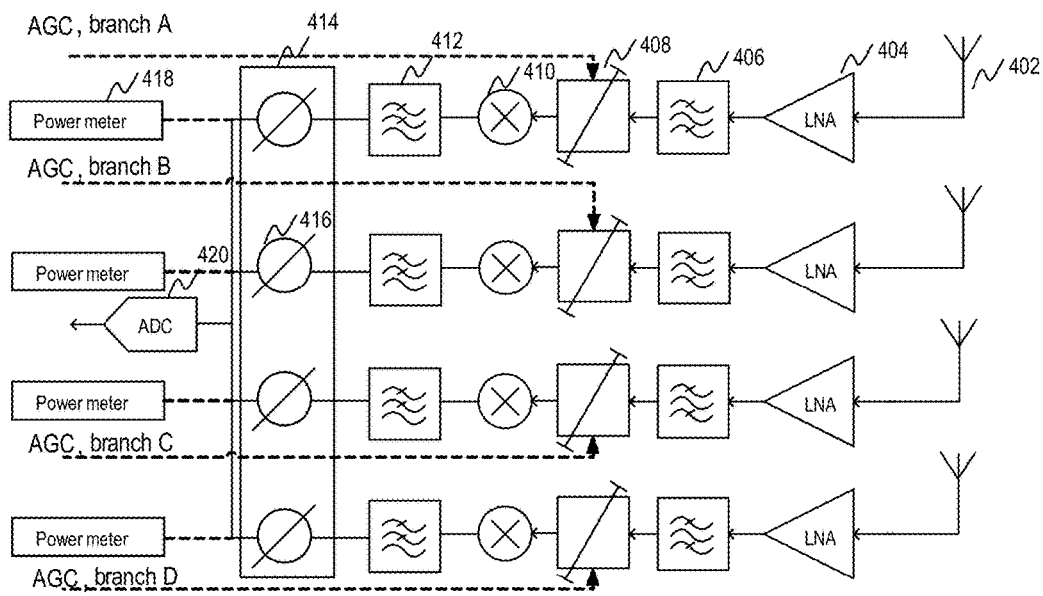
FIG. 4 shows an existing AGC deployment in a receiver.

Currently, there are three kinds of existing AGC deployments in an analog beamforming receiver. FIG. 4 shows the first kind of AGC deployment in an analog beamforming receiver, which may be referred to as multi-branch AGC herein. As shown, four AGCs (e.g., attenuators 408) are separately deployed in respective receiver branches before an analog beamforming combiner 414. Each receiver branch comprises an antenna element 402, an LNA 404, a first filter 406, an attenuator 408, a mixer 410 and a second filter 412. The analog beamforming combiner 414 comprises four phase shifters 416, each of which is used for phase adjustments on a signal from a receiver branch. There are four power meters 418, each of which is used to measure the power level of a single from a receiver branch. The measured power level may be used to trigger the operation of a corresponding attenuator 408. An ADC 420 is used to convert the combined signal from the analog beamforming combiner 414 to a digital signal.

Figure 5:
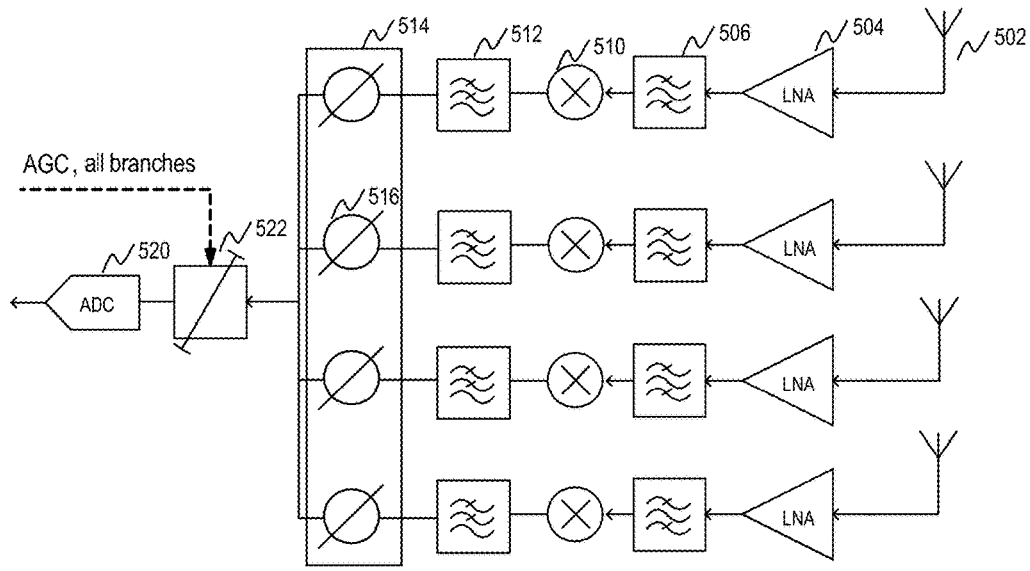
FIG. 5 shows another existing AGC deployment in a receiver.

FIG. 5 shows the second kind of AGC deployment in an analog beamforming receiver, which may be referred to as common path AGC herein. As shown, one attenuator 522 is allocated in the common path after the analog beamforming combiner 514. The other devices are similar to those shown in FIG. 4. The third kind of AGC deployment is a hybrid combination of multi-branch AGC and common path AGC.

Figure 6:
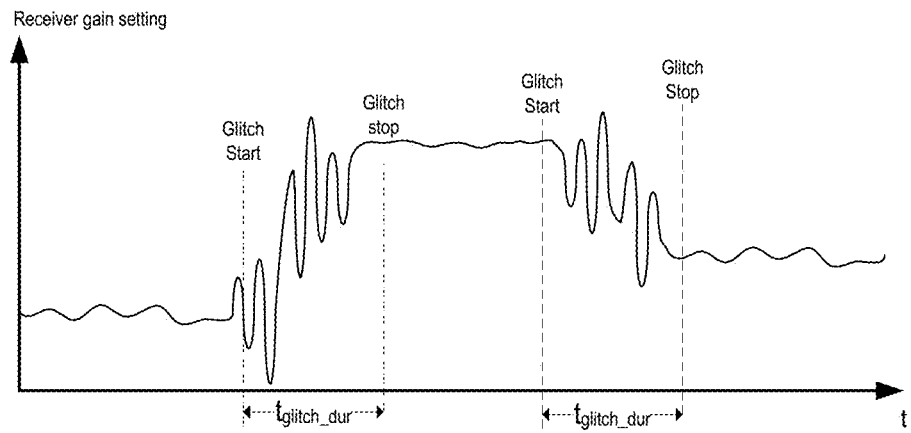
FIG. 6 shows a glitch phenomenon in existing AGC deployments.

However, there are inherent drawbacks for the above AGC deployments. Specifically, the rapid change of the signal power level and phase will generate glitch during the transition through different gain/attenuation paths in the receiver, as shown in FIG. 6. Since the toggling is trimmed to give a period of time interval in ms order between each state change, it means that the AGC needs at least a period of time interval in ms order to re-stabilize the receiver gain, after the interference hits the receiver. The glitch can affect the signal processing in the baseband in a negative way. Lots of glitches spread in time can cause the receiver efficiency to decrement rapidly and impact the throughput seriously. In the worst case, the receiving process would be temporarily interrupted or may even break down. The glitch suppression method implemented in existing signal processing is simply to insert zero data instead of the samples affected by the glitch, but the glitch suppression also means more complicated timing alignment to catch glitch.

For the multi-branch AGC shown in FIG. 4, the drawback is that the power meter in the DFE after the beamforming combiner could not identify which separate branch is blocked by the interference. Thus, one power meter should be reserved for each branch. For hundreds of branches, it means that lots of hardware cost and occupied printed circuit board (PCB) size have to be maintained for AGC function. Thus, it is almost impossible to be implemented in a massive MIMO.

For the common path AGC, the dynamic range of AGC will be huge compared with single branch AGC. The dynamic range of AGC is increasing with the number of antenna branches, based on principle of 10*log(N), where N is the number of antenna branches.

Besides, AGC is a radio standalone operation which is excluded by baseband beamforming (BBBF) physical layer processing. For tense massive MIMO BBBF layer processing, any possible optimization should be considered. Therefore, there is a need for an effective and low cost solution for receiving beam control.

The present disclosure proposes a solution for receiving beam control. It may overcome at least one of the drawbacks mentioned above, or it may not overcome any one of the drawbacks mentioned above. Hereinafter, the solution will be described in detail with reference to FIGS. 7-17.

Figure 7:
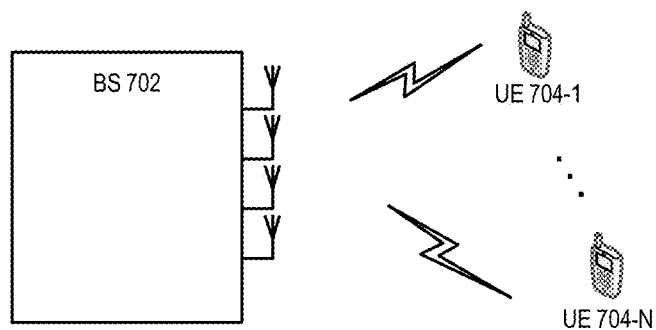
FIG. 7 shows a system to which the principle of the disclosure is applicable.

FIG. 7 shows a system to which the principle of the disclosure is applicable. As shown, the system is a wireless communication system, and may comprise a base station (BS) 702 supporting communication related services in a coverage area (also referred to as a cell). BS 702 is also capable of communicating with a plurality of UEs, i.e. UEs 704-1 to 704-N within the coverage area. The communications between BS 702 and UEs 704-1 to 704-N may employ any wireless communication standards such as CDMA, TDMA, FDMA, OFDMA, SC-FDMA and so on.

BS 702 comprises an antenna array. Based on the description given below, one skilled in the art will understand that the principle of the present disclosure may be applied to any BS with an antenna array. As an example, BS 702 may conform to 3G standards, and comprise a NodeB and a radio network controller (RNC). The NodeB may comprise a remote radio unit (RRU) and a building baseband unit (BBU). As another example, BS 702 may be an evolved Node B (eNodeB) conforming to long term evolution (LTE) standards. The eNodeB may comprise a RRU and a BBU. As still another example, BS 702 may be a gNB in a new radio (NR) system.

UEs 704-1 to 704-N may be referred to as, for example, devices, mobile stations, mobile units, subscriber stations, wireless terminals, terminals, or the like. Each one of them may be mobile or stationary, and may be, for example, a wireless handheld device such as a wireless phone, a computer with a wireless connection to a network, a wireless plug-in accessory, or the like.

Figure 8:
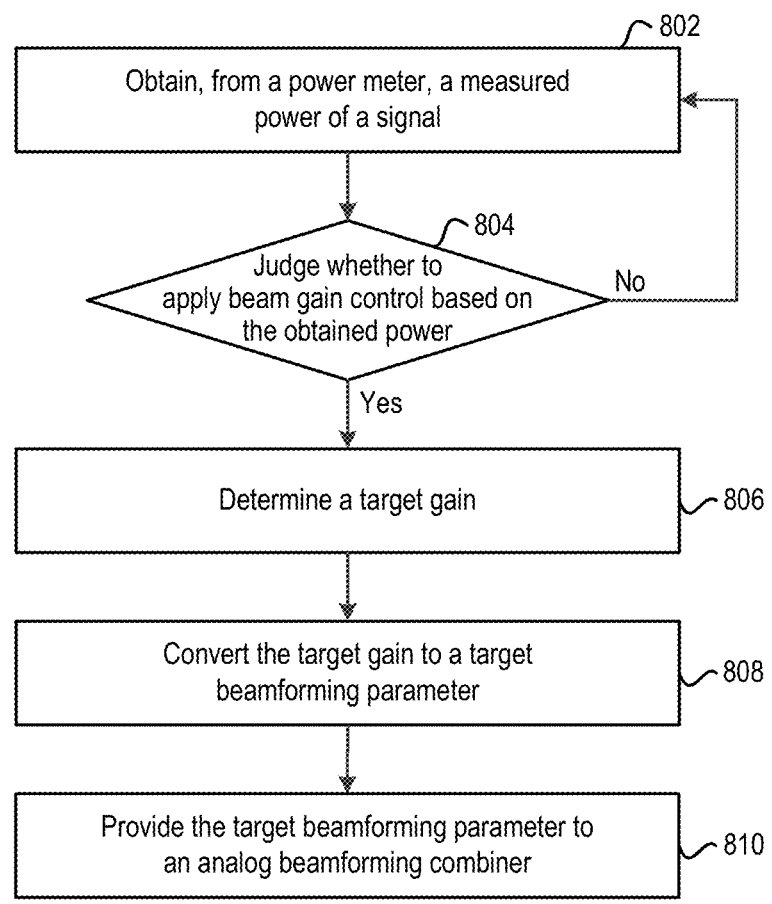
FIG. 8 is a flowchart illustrating a method for receiving beam control according to an embodiment of the disclosure.

FIG. 8 is a flowchart illustrating a method for receiving beam control according to an embodiment of the disclosure. The method may be performed by for example the processor and the memory of a radio unit (e.g., RRU as described above) or a separate controller in the radio unit. At step 802, a measured power of a signal is obtained from a power meter, wherein the signal is generated by a beamforming combiner by combining multiple inputs from an antenna array, and represents a first receiving beam with a first gain and a first pointing direction.

The antenna array may comprise at least one set of antenna elements for receiving RF transmissions from a UE for example. Each set of antenna elements may correspond to a receiving beam with a pointing direction and a gain in the pointing direction. For example, three sets of antenna elements may be used to generate three receiving beams which are separated from each other by 120 degrees. During one cycle of beam sweeping for example, each antenna element set may sequentially generate a series of receiving beams with different pointing directions such that each antenna element set can sweep one-third of the cell.

The multiple inputs from the antenna array may come from a set of antenna elements directly or indirectly via a RF processing unit. The beamforming combiner may apply a beamforming weight vector (or a codebook) to the multiple inputs and combine them to generate the signal. The beamforming combiner may comprise for example a plurality of phase shifters for applying phase shifts corresponding to the beamforming weight vector to the multiple inputs. Optionally, the beamforming combiner may further comprise an amplitude adjustment capability. To this end, it may comprise for example an attenuator.

Since each weight vector can uniquely identify a beam, the generated signal represents a receiving beam with a first gain and a first pointing direction. In beam sweeping for example, the first gain used initially for the first pointing direction may be predefined for example according to the network operator's configuration or a communication standard. As mentioned hereinbefore, to achieve the maximum coverage, the initially used first gain may be set to a maximum gain. During a cycle of beam sweeping for example, by changing the weight vector applied to the multiple inputs, other receiving beams with different pointing directions may be sequentially generated to sweep the cell.

The signal generated by the beamforming combiner is an analog signal. It may come to the power meter directly from the beamforming combiner. In this case, the power meter is an analog power meter. Alternatively, the signal may come to the power meter from the beamforming combiner via an ADC which converts the signal to a digital one. In this case, the power meter is a digital power meter.

At step 804, it is judged whether to apply beam gain control based on the obtained power. For example, at least one power threshold may be predefined according to the network operator's configuration or a communication standard, and the judgment may be made by comparing the obtained power with the at least one power threshold.

If it is judged at step 804 that beam gain control is not to be applied, the process may proceed to step 802 such that the signal's power can be monitored. On the other hand, if it is judged at step 804 that beam gain control is to be applied, a target gain is determined at step 806. The target gain may be greater than or smaller than the first gain depending on the obtained power.

Figure 9A:
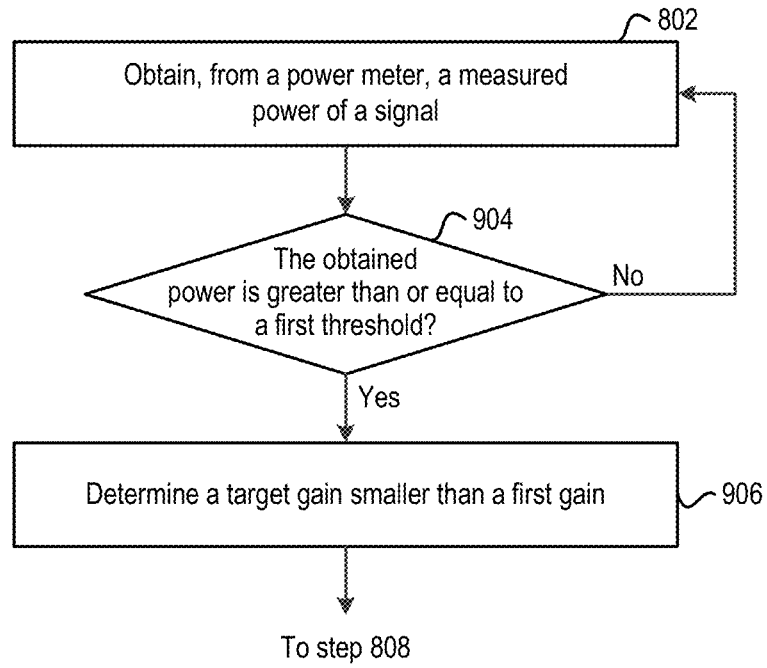
FIGS. 9A and 9B are flowcharts for explaining the method of FIG. 8.

As a first example, steps 804 and 806 may be implemented as steps 904 and 906 of FIG. 9A. At step 904, it is judged whether the obtained power is greater than or equal to a first threshold. The first threshold may be a predefined value or a value defined in a communication standard. The first threshold may be different in different wireless communication systems or for different service cells or beam directions. If the judgment result at step 904 is negative (e.g., the obtained power is smaller than the first threshold), the process may proceed to step 802. On the other hand, if the judgment result at step 904 is positive (e.g., the obtained power is greater than or equal to the first threshold), it is determined at step 906 a target gain which is smaller than the first gain. In this way, when a high power signal (e.g., interference) occurs, the saturation of the receiver can be avoided.

Figure 9B:
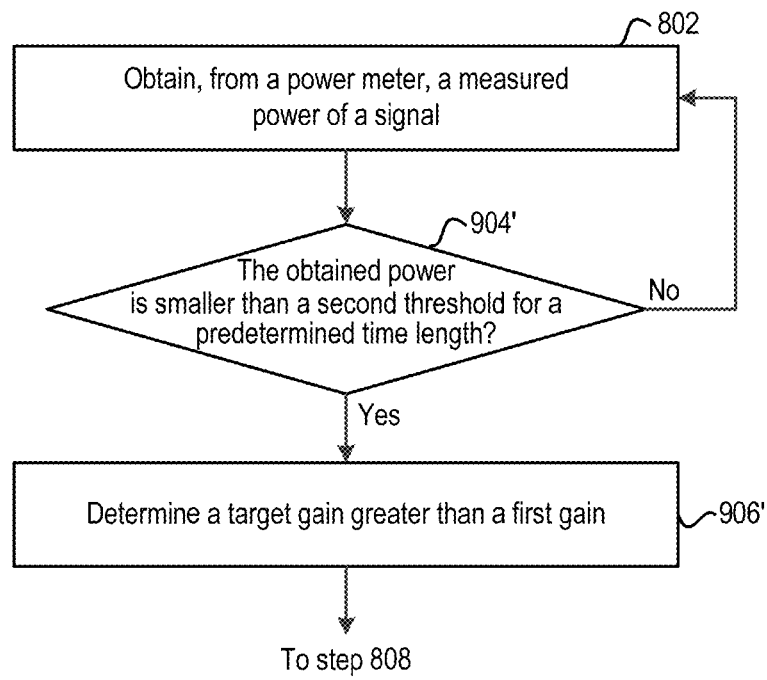

As a second example, steps 804 and 806 may be implemented as steps 904' and 906' of FIG. 9B. At step 904', it is judged whether the obtained power is smaller than a second threshold for a predetermined time length. Similar to the first threshold, the second threshold may be a predefined value or a value defined in a communication standard. The second threshold may be different in different wireless communication systems or for different service cells or beam directions. The predetermined time length may be a predefined by the network operator or defined in a communication standard. The predetermined time length may be different in different wireless communication systems or for different service cells or beam directions. If the judgment result at step 904' is negative (e.g., the obtained power is not smaller than the second threshold for a predetermined time length), the process may proceed to step 802. On the other hand, if the judgment result at step 904' is positive (e.g., the obtained power is smaller than the second threshold for a predetermined time length), it is determined at step 906' a target gain which is greater than the first gain. In this way, a receiving beam having too small gain for a period of time can be recovered to a receiving beam with a higher gain.

As a third example, steps 804 and 806 may be implemented as a combination of the steps of FIGS. 9A and 9B. Firstly, step 904 is performed. If the judgment result at step 904 is positive, step 906 is performed, and then the process proceeds to step 808. On the other hand, if the judgment result at step 904 is negative, step 904' is performed.

If the judgment result at step 904' is positive, step 906' is performed, and then the process proceeds to step 808. On the other hand, if the judgment result at step 904' is negative, the process may proceed to step 802.

Figure 10:
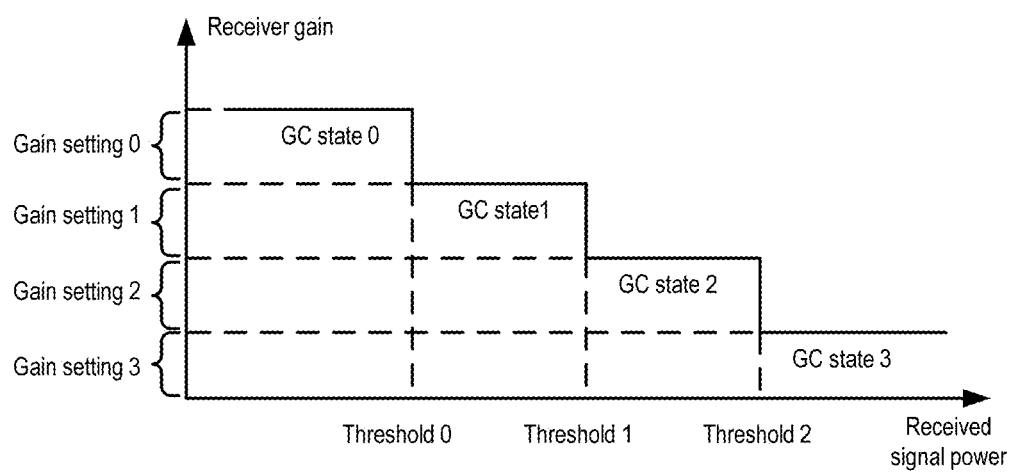
FIG. 10 is a schematic diagram showing a gain setting configuration according to an embodiment of the disclosure.

A suitable gain setting configuration for use by step 806 is shown in FIG. 10. As shown, four gain control (GC) states are employed as an exemplary example. In the beam sweeping example mentioned above, the initial gain may correspond to GC state 0. If the obtained power is for example greater than threshold 2 (in this case, the first threshold is threshold 2), the target gain may be determined as GC state 3. Afterwards, if the obtained power is for example within the range of (threshold 0, threshold 1) for a predetermined time length (in this case, the second threshold is threshold 1), the target gain may be determined as GC state 1. It is apparent from FIG. 10 that the number of the first or second thresholds may be more than one, and the first threshold may be identical to or different from the second threshold. The gain settings shown in FIG. 10 are only used for explanation purpose, and there may be other suitable gain settings in other embodiments.

At step 808, the target gain is converted to a target beamforming parameter. The target beamforming parameter may be used by the beamforming combiner to generate a second receiving beam with the target gain and the first pointing direction. Step 808 may be implemented by using any existing precoding techniques. In the example of FIG. 10 mentioned above, for each of a plurality of pointing directions in beam sweeping for example, there are four beam gains which may be converted to four codebooks. Thereby, codebooks whose total number equals to the number of the pointing directions multiplied by four can be generated in advance. Accordingly, the target gain together with the first pointing direction may be mapped to a corresponding codebook. In this case, the target beamforming parameter is represented by one of a set of codebooks, wherein the set of codebooks contain weight vectors applied to the multiple inputs for generating receiving beams with multiple pointing directions and multiple gains in each pointing direction. In this way, the existing precoding architecture can be used to perform receiver gain control instead of AGC.

Figure 11:
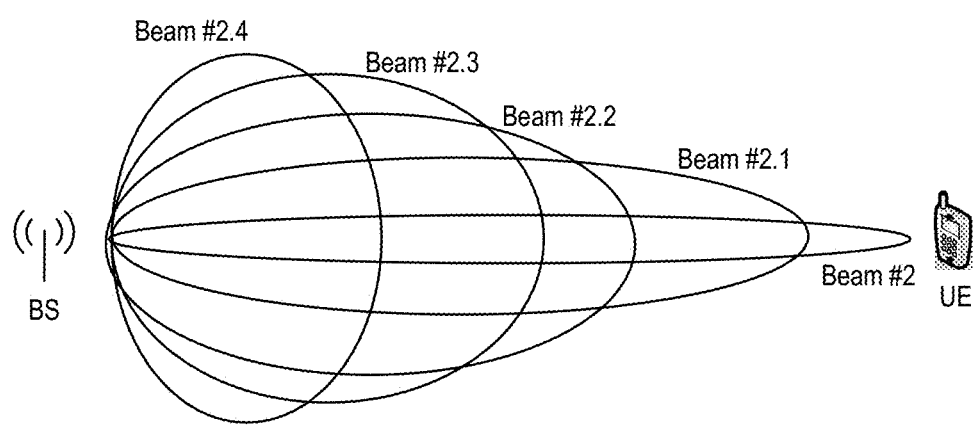
FIG. 11 shows beam indices according to an embodiment of the disclosure.

It should be noted that the present disclosure is not limited to the above example. The target beamforming parameter may be any suitable parameter depending on the specific implementation of the beamforming combiner. As another example, the target beamforming parameter may be represented by a beam index comprising two levels of indices, wherein a first level of index corresponds to a pointing direction of a receiving beam, and a second level of index corresponds to a gain of the receiving beam. In this case, a table for mapping beam indices to codebooks may be set in the beamforming combiner. An exemplary example of such beam index is shown in FIG. 11. In this example, the beam indices "2.1", "2.2", "2.3" and "2.4" each have two levels of indices, wherein the first level of index "2" corresponds to the pointing direction, and the second level of indices "1", "2", "3" or "4" correspond to the beam gain.

At step 810, the target beamforming parameter is provided to the beamforming combiner, such that the first receiving beam is replaced by a second receiving beam with the target gain and the first pointing direction. The beamforming combiner may use the target beamforming parameter (e.g., the codebook, the beam index, or the like) to generate the second receiving beam. In this way, the analog beamforming architecture/process can be adaptive with various and dynamic blocking scenarios. For example, when a strong signal (e.g., interference) occurs, a beam with lower beamforming gain and similar pointing direction can replace the high beamforming gain beam so that the received signal power is lower. Thereby, the AGC processing can be eased or replaced, and thus the need for hardware for the traditional AGC can be avoided or reduced. Furthermore, the above solution is much applicable in analog beamforming with low cost and small time latency in processing. It should be noted that although the method of FIG. 8 is described above by taking beam sweeping scenario as an example, the method of FIG. 8 can also applied to any other suitable scenarios where analog beamforming is utilized.

Figure 12A:
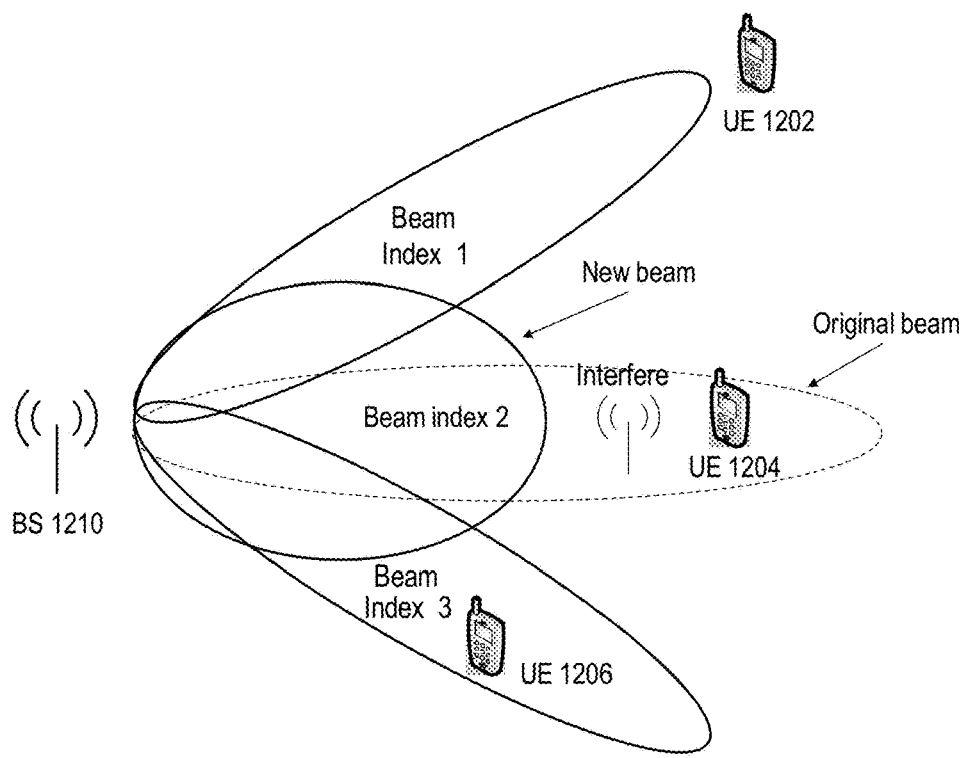
FIGS. 12A and 12B are schematic diagrams of beam sweeping according to an embodiment of the disclosure.
Figure 12B:
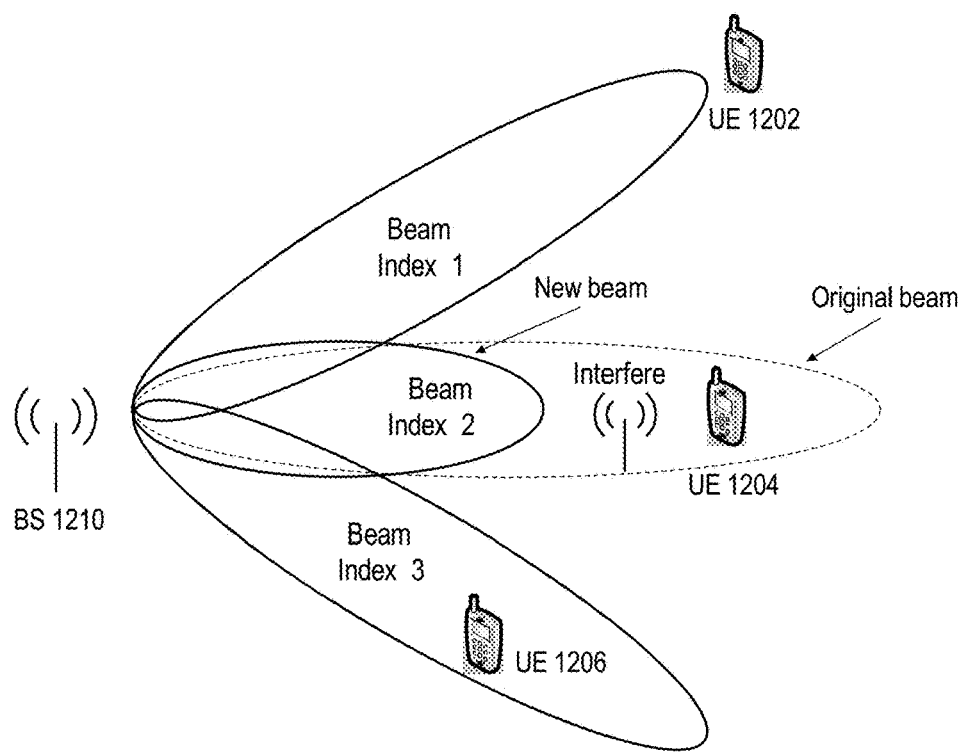

FIGS. 12A and 12B are schematic diagrams showing beam sweeping according to an embodiment of the disclosure. During the beam-sweeping procedure, the system is sweeping a sequence of predefined beams to cover an area. When a beam gain control is applied on a received signal, the beam used to cover that area will be replaced by a beam with another gain. As shown, BS 1210 sequentially generates three beams with different pointing directions to sweep the cell. Suppose that the first receiving beam described above is used in beam sweeping to listen toward the first direction indicated by beam index 2. In the direction indicated by beam index 2, there is an interference source between BS 1210 and UE 1204. Thus, when listening toward the direction indicated by beam index 2, the interference source may cause the signal's power received by BS 1210 to be greater than or equal to the first threshold, and then a target gain smaller than the first gain is applied. As a result, a new beam with the target gain in the same direction replaces the original beam. The beam indices of FIG. 11 may be applied to the scenarios shown in FIGS. 12A and 12B.

As shown in FIG. 12A, in the case where a beamforming combiner with no amplitude modification (i.e., with only phase-shifters) is used in the receiver, the new beam is a wider beam (with spatial beam-width increased) compared with the original beam. When the transmitting beam is changed similar to the receiving beam, the new wider transmitting beam may influence the operation of other neighboring base stations. Thus, the use of the wider transmitting beam may be reported to other neighboring base stations, and may also be transparent to the users of these neighboring base stations.

As shown in FIG. 12B, in the case where a beamforming combiner with an amplitude adjustment capability is used in the receiver, through proper phase/amplitude adjustments, the beam gain can be scaled without changing the antenna beam pattern ratio. That is, the new beam is still a narrow beam similar to the original beam. When the transmitting beam is changed similar to the receiving beam, the new narrow transmitting beam applies no influence to the operation of other neighboring base stations. Thus, the use of the new transmitting beam is not necessary to be reported to these neighboring base stations.

Figure 13:
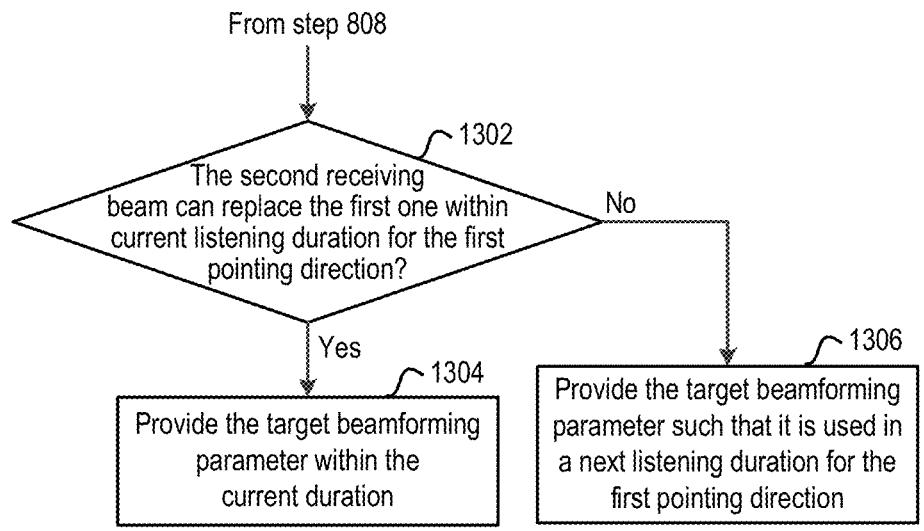
FIG. 13 is a flowchart illustrating a method for receiving beam control according to another embodiment of the disclosure.

FIG. 13 is a flowchart illustrating a method for receiving beam control according to another embodiment of the disclosure. In this embodiment, the first receiving beam is used in beam-sweeping to listen toward the first pointing direction. The method comprises steps 802-808 of FIG. 8 and steps 1302-1306. The details of steps 802-808 have been described above and thus are omitted here.

At step 1302, it is checked whether the second receiving beam can replace the first receiving beam within current duration for listening toward the first pointing direction. If the check result at step 1302 is positive (e.g., the current remaining duration for listening toward the first pointing direction is longer than the beam switching time), the target beamforming parameter is provided to the beamforming combiner within the current duration at step 1304.

On the other hand, if the check result at step 1302 is negative (e.g., the current remaining duration for listening toward the first pointing direction is too short or the hardware cannot support such transition on-the-fly), the target beamforming parameter is provided to the beamforming combiner at step 1306 such that it is used as the initial beamforming parameter for a next duration of listening toward the first pointing direction. That is, when starting to listen toward the first pointing direction for the next time, the initially used first receiving beam is generated by applying the target beamforming parameter. Then, step 802 is performed to obtain the measured power of the signal representing the initially used first receiving beam. Then, step 804 is performed to judge whether to apply beam gain control. If beam gain control is not required, the process may proceed to step 802. On the other hand, if beam gain control is required, steps 806-810 are performed. For example, the following table may be maintained for indicating the list of beams to be used for next iteration of sweeping. It shows an exemplary case where the Beam #2 needs to apply a control gain. However, it is also possible that the initially used first receiving beam is generated by applying the same beamforming parameter as that for the previous listening duration. In this case, the performing of steps 802-810 can ensure that suitable beam gain is applied.

| | Direction 0 | Direction 1 | Direction 2 | Direction 3 | Direction . . . N |
|---|---|---|---|---|---|
| Beam ID | Beam #0 | Beam #1 | Beam #2 | Beam #3 | . . . Beam #N |

| | Direction 0 | Direction 1 | Direction 2 | Direction 3 | ... | Direction N |
|---|---|---|---|---|---|---|
| Beam ID after Beam gain control | Beam #0 | Beam #1 | Beam #2.4 | Beam #3 | ... | Beam #N |

In various embodiments described above, the beamforming parameter may be reported to a baseband processing unit such that the baseband processing unit can know which beam or beam gain has actually been used for the reception and thus can correctly process the received signal. For example, a message with such information may then be communicated from the beamforming combiner, the separate controller or the digital front-end to the baseband processing unit.

Figure 14:
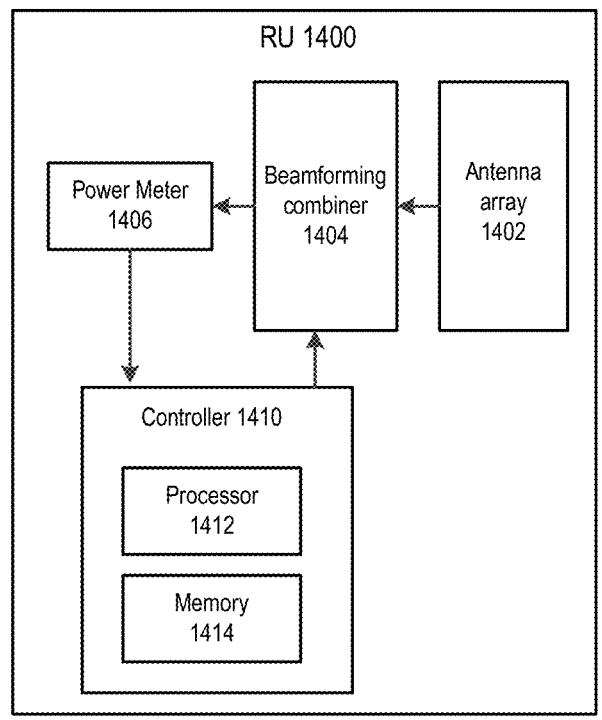
FIG. 14 is a block diagram showing a controller and a radio unit according to an embodiment of the disclosure.

FIG. 14 is a block diagram showing a controller and a radio unit (RU) according to an embodiment of the disclosure. As shown, the controller 1410 comprises a processor 1412 and a memory 1414. The memory 1414 contains instructions which may be executed by the processor 1412 to cause the controller 1410 to perform the method steps described above with reference to FIGS. 8-13.

The RU 1400 comprises an antenna array 1402, a beamforming combiner 1404, a power meter 1406 and the controller 1410. As described above, the antenna array 1402 may comprise at least one set of antenna elements for receiving RF transmissions. The beamforming combiner 1404 is coupled to the antenna array 1402. It may apply a beamforming weight vector (or a codebook) to the multiple inputs from the antenna array 1402 and combine them to generate the signal which may represent a first receiving beam with a first gain and a first pointing direction. The power meter 1406 is coupled to the beamforming combiner 1404, and may measure the signal's power.

Figure 15:
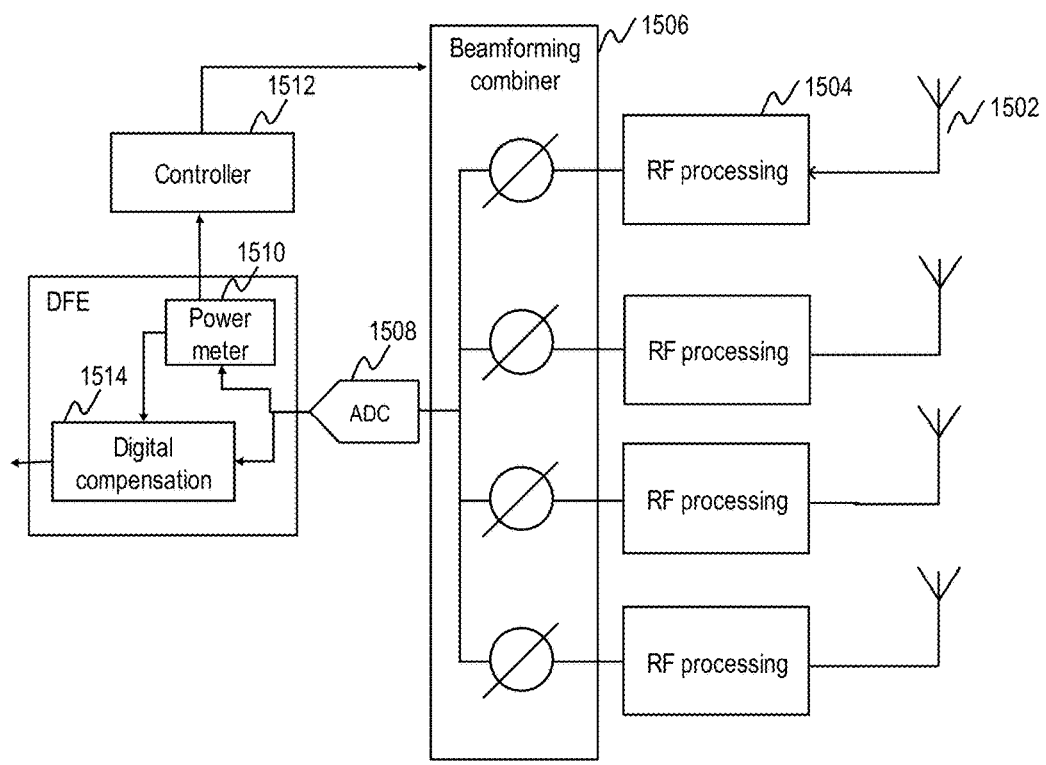
FIG. 15 is a schematic architectural diagram showing a radio unit according to another embodiment of the disclosure.

FIG. 15 is a schematic architectural diagram showing a radio unit according to another embodiment of the disclosure. As shown, the RU 1500 comprises an antenna array 1502, a plurality of RF processing units 1504 each of which is connected to an antenna element of the antenna array 1502, a beamforming combiner 1506, an ADC 1508, a power meter 1510, a controller 1512 and a digital compensation unit 1514. This embodiment is similar to that of FIG. 14 except that this embodiment further comprises the RF processing units 1504, the ADC 1508 and the digital compensation unit 1514. The RF processing units 1504 are connected between the antenna array 1502 and the beamforming combiner 1506, and may perform RF-to-baseband processing. It may be implemented similar to existing RF processing units such as shown in FIGS. 4 and 5. The ADC 1508 is connected between the beamforming combiner 1506 and the power meter 1510, and is disposed in a DFE. The ADC 1508 may convert the signal from the beamforming combiner 1506 to a digital one. The digital compensation unit 1514 may provide relative digital power compensation to keep uniform receiver gain, and may be implemented similar to any existing AGC.

It should be noted that the present disclosure is not limited to the example of FIG. 15. As another example, an RF processing unit may be connected between the beamforming combiner and the ADC. As still another example, an RF processing unit may be connected after the power meter. As still another example, the power meter may be connected between the beamforming combiner and the ADC, and thus is an analog power meter.

Figure 16A:
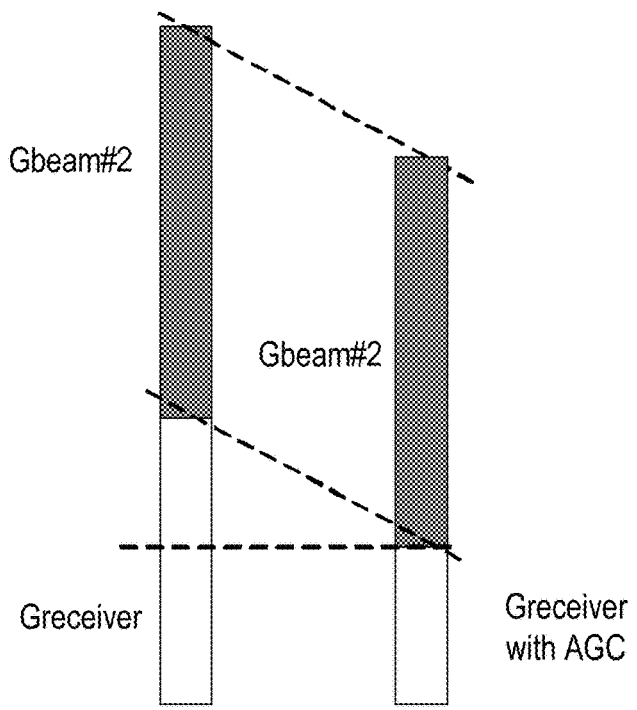
FIGS. 16A and 16B show the comparison between the present disclosure and an existing AGC.
Figure 16B:
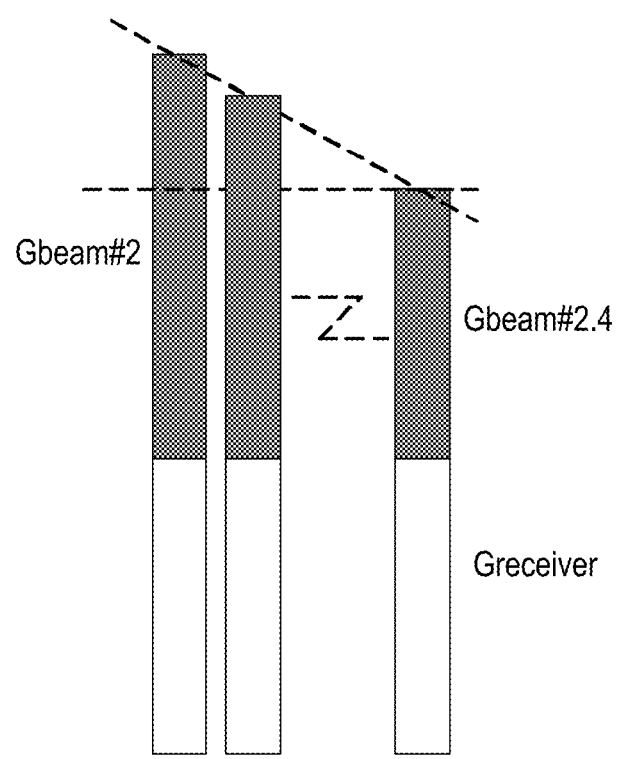

FIGS. 16A and 16B show the comparison between the present disclosure and an existing AGC. They demonstrate a simplified mapping between beam index and receiver gain/dynamic range, wherein FIG. 16A corresponds to the existing AGC and FIG. 16B corresponds to the beam gain control of the present disclosure. In FIGS. 16A and 16B, beam #2 is taken as example for illustration, wherein Gbeam #2 represents a gain of Beam #2, Gbeam #2.4 represents a gain of Beam #2.4, and Greceiver represents a gain of the receiver.

For overall uplink (UL) gain, it is the sum of Gbeam and Greceiver to bring enough UL signal noise ratio (SNR) for digital and baseband processing. For the existing AGC, the sum of (Gbeam+Greceiver with AGC) is shown in FIG. 16A. It can be seen that Gbeam #2 is fixed, and Greceiver is dynamically changed. For the present disclosure, the sum of (different Gbeam+Greceiver) is shown in FIG. 16B. it can be seen that Gbeam is dynamically changed from Gbeam #2 to Gbeam #2.4 to mitigate Greceiver dynamic range shown in FIG. 16A, all or partly, with a good defined beam gain control. In this way, the glitch problem caused by the traditional AGC adjustment can be fully avoided to support the possible rapid beamforming gain adjustments in analog beamforming without cost and complexity increasing.

Figure 17:
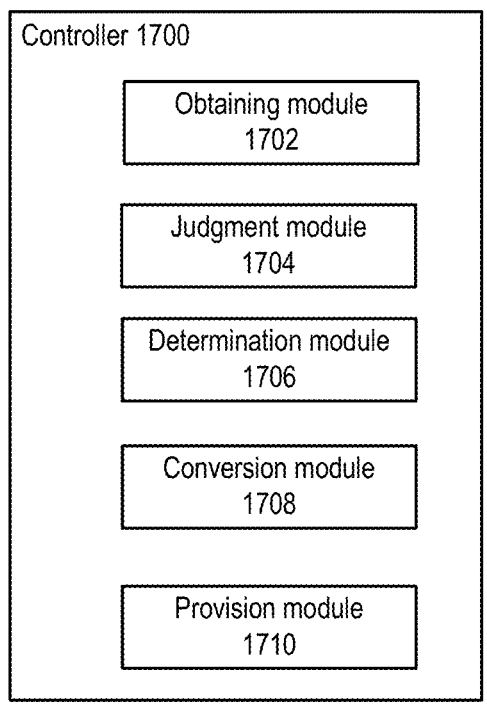
FIG. 17 is a block diagram showing a controller according to another embodiment of the disclosure.

FIG. 17 is a block diagram showing a controller according to another embodiment of the disclosure. As shown, the controller 1700 comprises an obtaining module 1702, a judgment module 1704, a determination module 1706, a conversion module 1708 and a provision module 1710. The obtaining module 1702 may be configured to perform step 802. The judgment module 1704 may be configured to perform steps 804, 904 or 904'. The determination module 1706 may be configured to perform steps 806, 906 or 906'. The conversion module 1708 may be configured to perform step 808. The provision module 1710 may be configured to perform step 810 or steps 1302-1306. Optionally, the controller 1700 may further comprise a reporting module configured to report the beamforming parameter to a baseband processing unit.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A method for receiving beam control in multiple-input multiple-output (MIMO) system, comprising:
   obtaining, from a power meter, a measured power of a signal, wherein the signal is generated by a beamforming combiner by combining multiple inputs from an antenna array, and represents a first receiving beam with a first gain and a first pointing direction;
   judging whether to apply beam gain control based on the obtained power;
   in response to a positive judgment result, determining a target gain;
   converting the target gain to a target beamforming parameter; and
   providing the target beamforming parameter to the beamforming combiner, such that the first receiving beam is replaced by a second receiving beam with the target gain and the first pointing direction.

2. The method according to claim 1, wherein the step of judging comprises judging whether the obtained power is greater than or equal to a first threshold; and
   wherein the step of determining comprises: when the obtained power is greater than or equal to the first threshold, determining a target gain which is smaller than the first gain.

3. The method according to claim 1, wherein the step of judging comprises judging whether the obtained power is smaller than a second threshold for a predetermined time length; and
   wherein the step of determining comprises: when the obtained power is smaller than the second threshold for the predetermined time length, determining a target gain which is greater than the first gain.

4. The method according to claim 1, wherein the target beamforming parameter is represented by:
   a beam index comprising two levels of indices, wherein a first level of index corresponds to a pointing direction of a receiving beam, and a second level of index corresponds to a gain of the receiving beam; or
   one of a set of codebooks which contain weight vectors applied to the multiple inputs for generating receiving beams with multiple pointing directions and multiple gains in each pointing direction.

5. A controller for receiving beam control in multiple-input multiple-output (MIMO) system, comprising:
   a processor; and
   a memory, the memory containing instructions executable by the processor, whereby the controller is operative to:
      obtain, from a power meter, a measured power of a signal, wherein the signal is generated by a beamforming combiner by combining multiple inputs from an antenna array, and represents a first receiving beam with a first gain and a first pointing direction;
      judge whether to apply beam gain control based on the obtained power;
      in response to a positive judgment result, determine a target gain;
      convert the target gain to a target beamforming parameter; and
      provide the target beamforming parameter to the beamforming combiner, such that the first receiving beam is replaced by a second receiving beam with the target gain and the first pointing direction.

6. The controller according to claim 5, wherein the instructions are executable by the processor, whereby the controller is operative to judge whether to apply beam gain control by: judging whether the obtained power is greater than or equal to a first threshold; and
   wherein the instructions are executable by the processor, whereby the controller is operative to determine a target gain by: when the obtained power is greater than or equal to the first threshold, determining a target gain which is smaller than the first gain.

7. The controller according to claim 5, wherein the instructions are executable by the processor, whereby the controller is operative to judge whether to apply beam gain control by: judging whether the obtained power is smaller than a second threshold for a predetermined time length; and
   wherein the instructions are executable by the processor, whereby the controller is operative to determine a target gain by: when the obtained power is smaller than the second threshold for the predetermined time length, determining a target gain which is greater than the first gain.

8. The controller according to claim 5, wherein the target beamforming parameter is represented by:
   a beam index comprising two levels of indices, wherein a first level of index corresponds to a pointing direction of a receiving beam, and a second level of index corresponds to a gain of the receiving beam; or
   one of a set of codebooks which contain weight vectors applied to the multiple inputs for generating receiving beams with multiple pointing directions and multiple gains in each pointing direction.

9. The controller according to claim 5, wherein the instructions are executable by the processor, whereby the controller is further operative to:
   report the beamforming parameter to a baseband processing unit.

10. A radio unit (RU) for a base station (BS), comprising:
    an antenna array;
    a beamforming combiner coupled to the antenna array;
    a power meter coupled to the beamforming combiner; and
    the controller according to claim 7.

11. The RU according to claim 10, wherein the beamforming combiner is connected directly to the antenna array, or connected to the antenna array via a radio frequency (RF) processing unit.

12. The RU according to claim 10, wherein the power meter is connected directly to the beamforming combiner, or connected to the beamforming combiner via an analog-to-digital converter.

13. The RU according to claim 10, wherein the beamforming combiner has an amplitude adjustment capability.

14. The RU according to claim 10, wherein the instructions are executable by the processor, whereby the controller is operative to judge whether to apply beam gain control by: judging whether the obtained power is greater than or equal to a first threshold; and wherein the instructions are executable by the processor, whereby the controller is operative to determine a target gain by: when the obtained power is greater than or equal to the first threshold, determining a target gain which is smaller than the first gain.

15. The RU according to claim 10, wherein the instructions are executable by the processor, whereby the controller is operative to judge whether to apply beam gain control by: judging whether the obtained power is smaller than a second threshold for a predetermined time length; and wherein the instructions are executable by the processor, whereby the controller is operative to determine a target gain by: when the obtained power is smaller than the second threshold for the predetermined time length, determining a target gain which is greater than the first gain.

* * * * *